United States Patent
Blish et al.

(10) Patent No.: US 6,548,881 B1
(45) Date of Patent: Apr. 15, 2003

(54) METHOD AND APPARATUS TO ACHIEVE BOND PAD CRATER SENSING AND STEPPING IDENTIFICATION IN INTEGRATED CIRCUIT PRODUCTS

(75) Inventors: Richard C. Blish, Saratoga, CA (US); Pramod D. Patel, San Jose, CA (US); David E. Lewis, Sunnyvale, CA (US); Colin D. Hatchard, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 29 days.

(21) Appl. No.: 09/624,657

(22) Filed: Jul. 25, 2000

(51) Int. Cl.[7] .......................... H01L 29/00; H01L 23/58
(52) U.S. Cl. .......................................... 257/499; 257/48
(58) Field of Search ................................. 257/499, 503, 257/573, 584, 587, 618, 621, 734, 784, 786, 779, 780, 48

(56) References Cited

U.S. PATENT DOCUMENTS 3,569,796 A * 3/1971 Mulford, Jr. ................. 317/234
5,153,507 A * 10/1992 Fong et al. .............. 324/158 R
5,963,046 A * 10/1999 Konuk ........................ 324/765
6,147,413 A * 11/2000 Farnworth ................... 257/779

OTHER PUBLICATIONS

Thin–Film Cracking and Wire Ball Shear in Plastic Dips Due to Temperature Cycle and Thermal Shock, C.G. Shirley and R.C. Blish, 1987 IEEE/IRPS, pp. 238–249.*

Thin–Film Cracking and Wire Ball Shear in Plastic Dips Due to Temperature Cycle and Thermal Shock, C.G. Shirley and R.C. Blish, no month provided 1987 IEEE/IRPS, pp. 238–249.

* cited by examiner

Primary Examiner—Kamand Cuneo
Assistant Examiner—Scott B. Geyer

(57) ABSTRACT

Method for stepping identification and bond pad crater jeopardy identification in integrated circuits and apparatus which performs the method, A unique device, a polysilicon meander, is formed under each bond pad in the integrated circuit device. Connected to the meander is circuitry for determining the electrical, and hence mechanical, integrity of the meander. Failure of the meander by reason of microcrack formation in the several layers under the meander is detected by the high resistance of the meander. The circuitry will also resolve any potential mismatch between the actual mask revision of the integrated circuit and the corresponding revision of the test program.

10 Claims, 6 Drawing Sheets

METHOD AND APPARATUS TO ACHIEVE BOND PAD CRATER SENSING AND STEPPING IDENTIFICATION IN INTEGRATED CIRCUIT PRODUCTS

BACKGROUND OF THE INVENTION

1. Field of the Invention

The present invention relates to reliability and packaging of electronic devices, particularly integrated circuit devices. More particularly, the present invention relates to a methodology for verifying the reliability of the interface between bond pads and other structures in integrated circuits. The present invention further resolves potential mismatches which can occur between revisions of masks used to form an electronic device and corresponding revisions of the test program used for evaluating the device.

2. Discussion of the Related Art

Integrated circuit devices manufactured on silicon wafers are typically separated into individual IC chips and assembled into packages. One of the principal functions of the package is to allow connection of the chip to a circuit board or other electronic product. Such connection can generally not be made directly from the chip to the target product due to the thin, fragile microscopic metal structure used to interconnect the several components on the chip surface. Many metal leads on the IC are typically about 0.6 µm thick and less than 1.0 µm wide. Indeed, many of the surface features of current production integrated circuits are "sub-micron" or less than 1.0 µm in width. Therefore, "bond pads" approximately 100 uM square are typically placed around the periphery of the IC chip. "Bond wires" are then used to connect the IC chip to the packaging frame. This frame is then usually "encapsulated" with either plastic or ceramic materials to complete the packaging process.

A common IC lead and bond pad material is aluminum that is deposited and patterned during chip fabrication. The gold or aluminum bond wire used to connect the bond pad to the package frame is currently available is typically in the range of 17 to 30 µm in diameter, many times larger than the integrated circuit's surface wiring. Bond wires are typically connected to the bond pads by means of metal balls (gold) or wedge bonds (aluminum) formed at the end of the bond wires and applied to the bond pad. Bond wires may be attached by thermosonic bonding, or other wire attachment methodology well known to those of ordinary skill in the art.

The first problem which occurs in some integrated circuit devices is "cratering" in the layers under the bond pads. Cratering is generally a fracture of the silicon and dielectric oxide layers under the bond pad. This phenomenon is sometimes referred to as "bond pad cratering". While studies to determine exact mechanisms for crater initiation and propagation are still underway, an overview of some of the known mechanics of crater formation is discussed as follows.

One process which has been shown to be contributory to crater initiation is the use of thermosonic attachment methodology for attaching bond wires to bond pads. Thermosonic bonding employs ultrasonic vibration, typically about 60–120 kHz, to form the bond This dynamic is shown in FIG. 1. It illustrates a cross-section through an integrated circuit—IC (1). The device is formed of a plurality of layers and includes one or more bond pads (2). In this example the layers of the IC (1) include silicon substrate (4), field oxide layer (6), BPSG layer (8), passivation layer (9) and plastic encapsulant (10). A wire bond (12) is shown including bonding ball (14). The center of the die is located toward the direction labeled "Z". This listing of layers in the device is not meant to be exhaustive but is illustrative of some of the several layers of a micro-electronic device known in the art.

During the wire bonding process wire bond ball (14) is attached to bond pad (2) utilizing, for example, thermosonic bonding. The bonding process can induce microcracks (20). With repeated thermal cycling these microcracks can propagate (24) in the layers beneath the bond pad causing chip failure. Some of these mechanisms are described below.

FIGS. 2A, 2B, and 2C are plan views of a section of a packaged IC directly beneath a bond pad after the chemical removal of the bond wire ball which illustrates microcrack initiation and propagation. FIGS. 2A', 2B', and 2C' are cross-sections through the same section with the bond pads and bond wires intact.

The physical propagation of a microcrack into a full-blown pad crater is shown in FIG. 2. FIGS. 2A and 2A' show a microcrack (20) that has been formed in a layer immediately beneath bond pad (2). With repeated thermal cycling this microcrack propagates in the direction shown (26) in FIGS. 2B and 2B'. With continued thermal cycling, crack propagation moves in a generally elliptical manner (FIG. 2B) and downward (FIG. 2B'). It should be noted that this elliptical crater (FIG. 2') is formed with its short axis aligned along a line originating substantially near the chip center.

FIG. 3 shows a scanning electron microscope (SEM) image of two areas underlying bond pads of an IC (1) which failed due to bond pad cratering. This generally elliptical crater formation, and its alignment with the center of the device is clearly shown in these photomicrographs. Cratering often results in intermittent contact between the internal IC wiring and the bond pad thus inducing a subtle and insidious reliability problem by precluding reliable electrical contact between the chip's surface wiring and the bond pads which in turn precludes a reliable contact with the bond wires and the package.

Finally, the formation of craters is a progressive process. This means that while a predisposition for crater formation in the form of microcracks may be present when the chip is going through the chip test procedures during manufacturing, a crater resulting in electrical failure may not have yet formed. This predisposition is referred to herein as "crater jeopardy". It is only after a substantial number of thermal cycles that the crater actually forms and attendant chip failure occurs.

It will be understood by those having skill in the art that the bond pad cratering phenomena previously discussed are still under investigation. While it is generally believed that microcracks are initiated by stresses induced by the dynamic force of the gold ball or aluminum wedge bond at touch-down impact, the static force applied after touch-down, the level of ultrasonic energy, mechanical vibrations before or after bonding, and/or the hardness of the gold ball in relation to the pad, the role which each of these mechanisms plays in crack/crater formation is still under investigation. Moreover, while the formation of cracks is believed to be dependent on the bonding mechanism, bond parameters, the thickness of the wire bond pad and characteristics of the wire bond material being bonded, the roles of each of these mechanisms is also under investigation. Furthermore, continued research has shown that thermal cycling and shock during the plastic encapsulation process may play a role in propagating bond pad crater formation.

While a number of mechanisms and procedures are currently being investigated to prevent bond pad crater formation and attendant chip failure, given the insidious nature of the onset of crater formation what is especially important is a practical methodology to detect microcracks under the bond pads during the manufacturing process. The methodologies previously utilized to detect bond pad crack/crater formation are insufficient, laborious and destructive as will now be described.

A first prior art methodology for monitoring crater jeopardy is by destructive decapsulation and deprocessing including the chemical removal of the ball bonds followed by visual inspection and high magnification. The results of one such SEM examination of the area under two bond pads suffering from bond pad crater formation is shown in FIG. 3. While this monitoring for crater jeopardy is particularly effective, it is the both laborious and destructive, and renders the device inoperative and unfit for further service. Clearly, this destructive and labor-intensive process cannot be effective for shippable products.

The second prior art methodology has been to undertake one or more functional tests of the chip subsequent to encapsulation. As previously discussed, one of the factors known to be important in bond pad crater formation is thermal cycling. Accordingly, it may require hundreds or even thousands of device heat/cool cycles before microcracks develop into full-blown bond pad craters with an attendant bond pad failure sufficient to trigger a functional test. Moreover, utilization of this test methodology has been shown to reduce the life expectancy of the device.

Finally, there exist special test structures for electrical detection of the problem. These usually include continuity tests or tests for electrical leakage by structures under the pad. While these tests structures have in some cases been shown to be effective for the detection of larger cracks and bond pad craters, they are not the optimal solution to the problem. In the first place, the use of these tests structures introduces one or more additional processes during manufacturing. Secondly, the accuracy and reliability of these test structures for detecting the microcracks shortly after their inception has not been proven.

A second problem not fully solved in the prior art comes about when a product is changed due to mask revisions which often results in a corresponding revision of the test program of the product. The importance of using the correct test program on the revised product will readily be understood, i.e., mismatches between the two are to be avoided.

Therefore, what is needed is a method to detect the formation of microcracks in the substrate immediately below the bond pad or bond pads of an IC. The methodology should enable the testing of each device during the manufacturing process without resorting to destructive test techniques. Moreover, the methodology should be capable of being implemented without unduly complicating or lengthening the normal manufacturing process for such devices. The methodology should not require additional bond pads or leads for the associated package.

What is further needed is a methodology to prevent the potential mismatch between actual mask revisions and the corresponding revision of the test program.

An especially elegant solution to these problems would be a single solution capable of simultaneously addressing and solving these two disparate issues.

SUMMARY OF THE INVENTION

The present invention teaches a methodology whereby 100 percent of the pads on chips undergoing manufacture can be effectively tested for the formation of cracks, most importantly small cracks, beneath the wire bond pad. The methodology is non-destructive in nature and does not overly complicate the manufacturing process. An additional benefit to the methodology is the capability to resolve differences between an actual mask revision and the corresponding revision of a test program.

The invention includes a polysilicon meander with a "down and back" pattern or a radial in/out pattern is formed beneath each bond pad. The meander pattern covers all the area beneath each bond bad and is connected on one end to the bond pad itself. The other end is connected to the source and one input terminal of a two-input NAND gate. The pad is driven high during testing, and a continuous meander causes one of the input terminals of the NAND gate to go high. If the other input terminal of the NAND gate is also driven high, there is then a low resistance between the source of the NAND gate which is connected back to the pad through the meander and the drain of the NAND gate which is connected to ground. Thus, a current would flow from the pad to the ground through the meander. Clearly, a fractured meander will not permit current to flow and a break would be detected provided the length of the fracture is greater than the pitch of the meander.

Connected to the other input terminal of the two-input NAND gate is the output terminal of an OR gate with two plural-input AND gates. The second input terminal of the NAND gate will go high if all of the input signals ("master keys", i.e., hard wired patterns) to either AND gate are driven high. Accordingly, a first master key pattern applied to the pads connected to a six input terminal AND gate, for example, would cause the output signal of that AND gate to go high and trip the OR gate and two-input NAND gate. The test sequence then individually tests each pad for craters except those pads to which the first master key is applied. When the test sequence is finished on all pads except the master key pads, a second master key is provided to the six input terminals of the other AND gate so that the six pads connected to the first AND gate can be checked.

The previously discussed test sequences not only disclose crater jeopardy beneath the bond pad, but also reveals a potential mismatch between actual mask revision and the corresponding revision of the test program.

Of particular note is the fact that the implementation of the present invention does not require significant additional space on the chip, nor extra bond pads or package leads thereby precluding any loss of feature density on the chip itself and packaging costs. Moreover, the testing step used to implement the methodology is not particularly time-consuming, thereby aiding in economy of manufacture.

It should be noted that the two input NAND gate, two input OR gate, and six input AND gates described above that are required to implement at least one aspect of the present invention are very small features compared to bond pads even when the attendant wiring is added.

The present invention is better understood upon consideration of the detailed description below in conjunction with the accompanying drawings. As will become readily apparent to those skilled in the art, there is shown and described embodiments of this invention by way of the illustration of the best mode to carry out the invention. The invention is capable of other embodiments and its several details are capable of modifications without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims.

DETAILED DESCRIPTION

Figure 1:
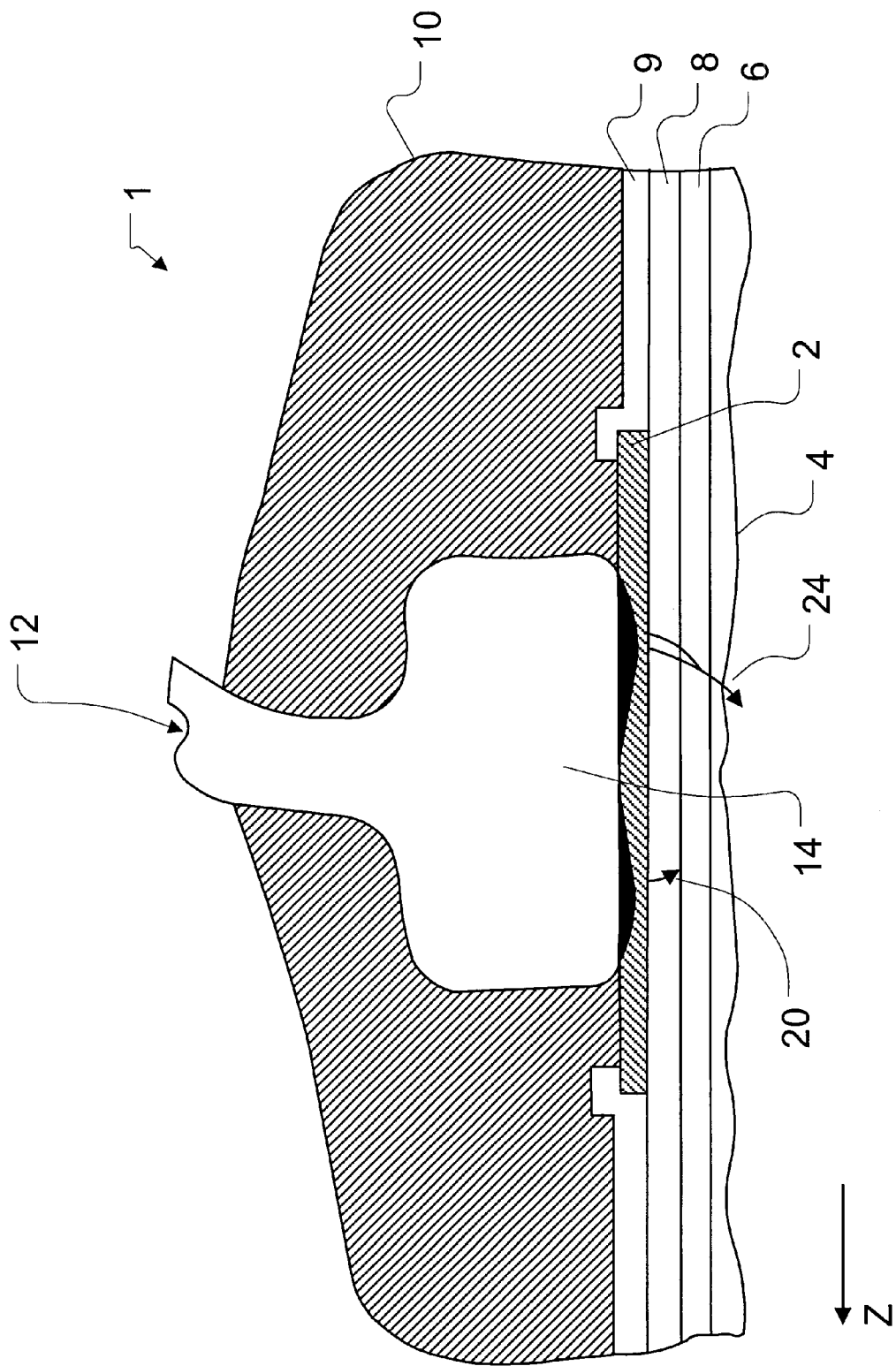
FIG. 1 is a cross sectional view taken through the wire bond pad of a microelectronic device demonstrating crater jeopardy beneath the pad.

Reference is now made in detail to specific embodiments of the present invention which illustrate the best mode presently contemplated by the inventors for practicing the invention. The structure and function of the present invention are explained in FIGS. 4 and 5. Sensor circuit (100) uses Boolean logic in testing for cracks in layers under a bond pad The sensor circuit (100) includes six-input AND gates (102 & 104) with input terminals (106 & 108) which are connected to respective groups of pads of the device which in turn are connected to respective device pins. The output terminals of the AND gates (102 & 104) are connected to the input terminals of an OR gate (110). The output terminal of the OR gate (110) connects to one input terminal of a two-input NAND gate (112) which has its output terminal connected to ground (114). The other input terminal of the NAND gate (112) is connected to the end of a polysilicon meander (116) which is located beneath a pad (118) shown in dotted lines which will be described later with reference to FIG. 5. The other end of the meander (116) is connected to the pad (118) by means of a via (120 in FIG. 5). Pad (118) is connected to pin (122 of FIG. 5). The end of the meander (116) connected to the input terminal of the NAND gate (112) is also connected to the source of the NAND gate (112).

Figure 5:
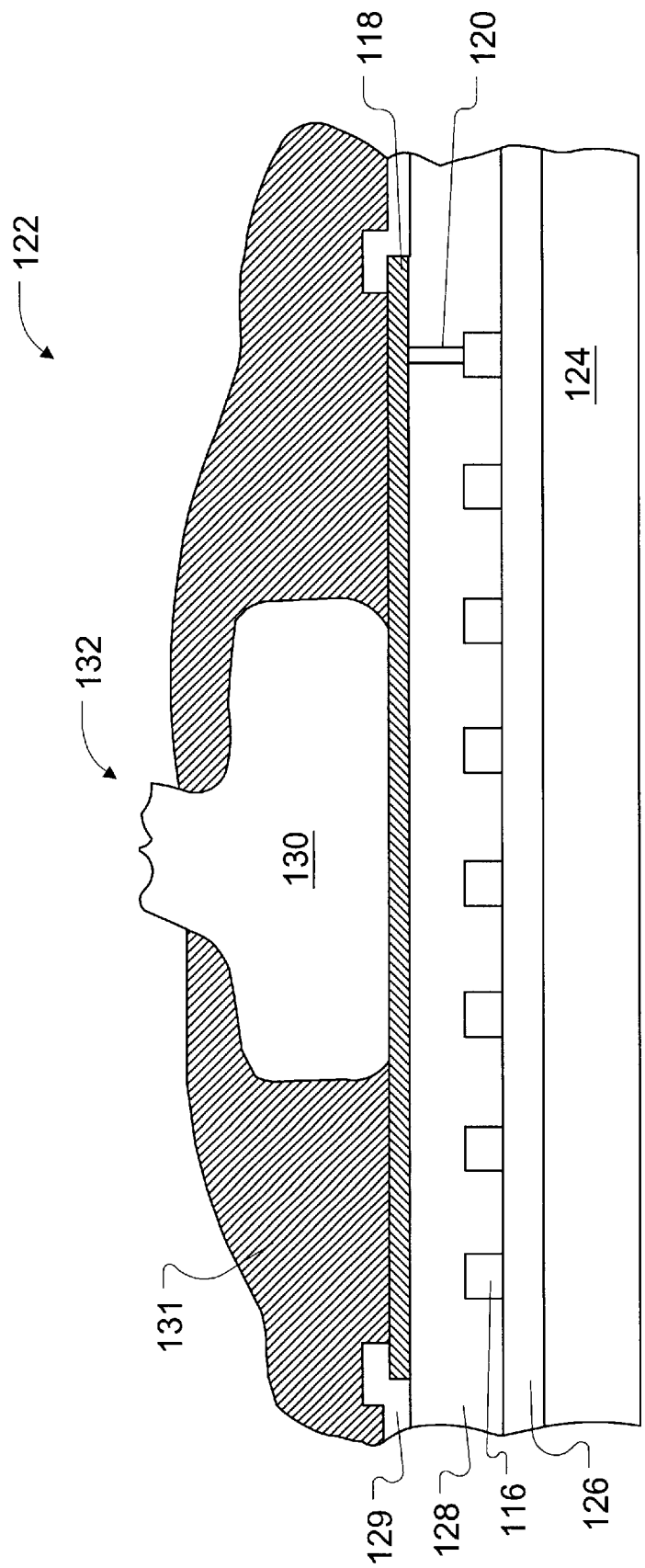
FIG. 5 is a sectional view taken along the line 5—5 of FIG. 4.

FIG. 5 shows a detailed view of the device incorporating the meander (116). The device includes a silicon substrate (124), a field oxide layer (126) and a deposited glass layer (128) on the field oxide layer (126). The meander (116) is formed on the field oxide layer (126) and is covered by glass layer (128). The metal bond pad (118) is deposited and patterned on the glass layer (128) and is connected to the meander (116) by the via (120) with a ball (130) of gold lead wire (132) secured to the pad (118). A passivation layer (129) and plastic encapsulant (131) are further provided.

The polysilicon meander (116) is preferably patterned closely beneath bond pad (118) although in some embodiments it may prove advantageous to form the meander (116) in another lower layer closer to silicon. Meander (116) may be patterned by plasma etching, ion beam etching, or any other etching or forming methodology well known to those having ordinary skill in the art. Furthermore, while polysilicon is chosen for the meander material according to one aspect of this invention, the principles enumerated specifically contemplate the use of the other conductive brittle materials including but not limited to silicon, metals, metallized layers, and other integrated circuit layer materials well known to those having ordinary skill in the art.

Meander (116) preferably covers substantially all the area beneath the bond pad (118). One geometry for such a meander is a "down and back" pattern shown in FIG. 4. While the principles of the present invention specifically contemplate a number of meander geometries, in one embodiment of the present invention it is envisioned that the width of the polysilicon arm (116') would be similar to the gate width of the device. In many current devices this feature is less than 0.25 $\mu$m. As will be explained later, the minimum detectable crack size would be roughly equal to the polysilicon pitch if the crack were orthogonal to the polysilicon line direction.

According to this embodiment, the number of squares of polysilicon meander length beneath a 100 by 100 $\mu$m square bond pad would be approximately 80 K. Assuming a polysilicon characteristic resistance of between 1 and 10 ohms per square, the polysilicon meander (116) would have a resistance of between 100 and 1000 k ohms assuming the meander remains whole. If, however, the meander (116) were fractured by virtue of the formation of or propagation of a microcrack in one of the layers beneath it, this resistance would become much higher. During normal device operating conditions, i.e. without all of the input signals of either AND gate (102 or 104) high, the sensor circuitry (100), including but not limited to gates (102, 104, 110 and 112) will be substantially invisible. This is because the NAND gate (112) will be in a high-impedance state thus breaking the connections of the pads to ground.

Figure 4:
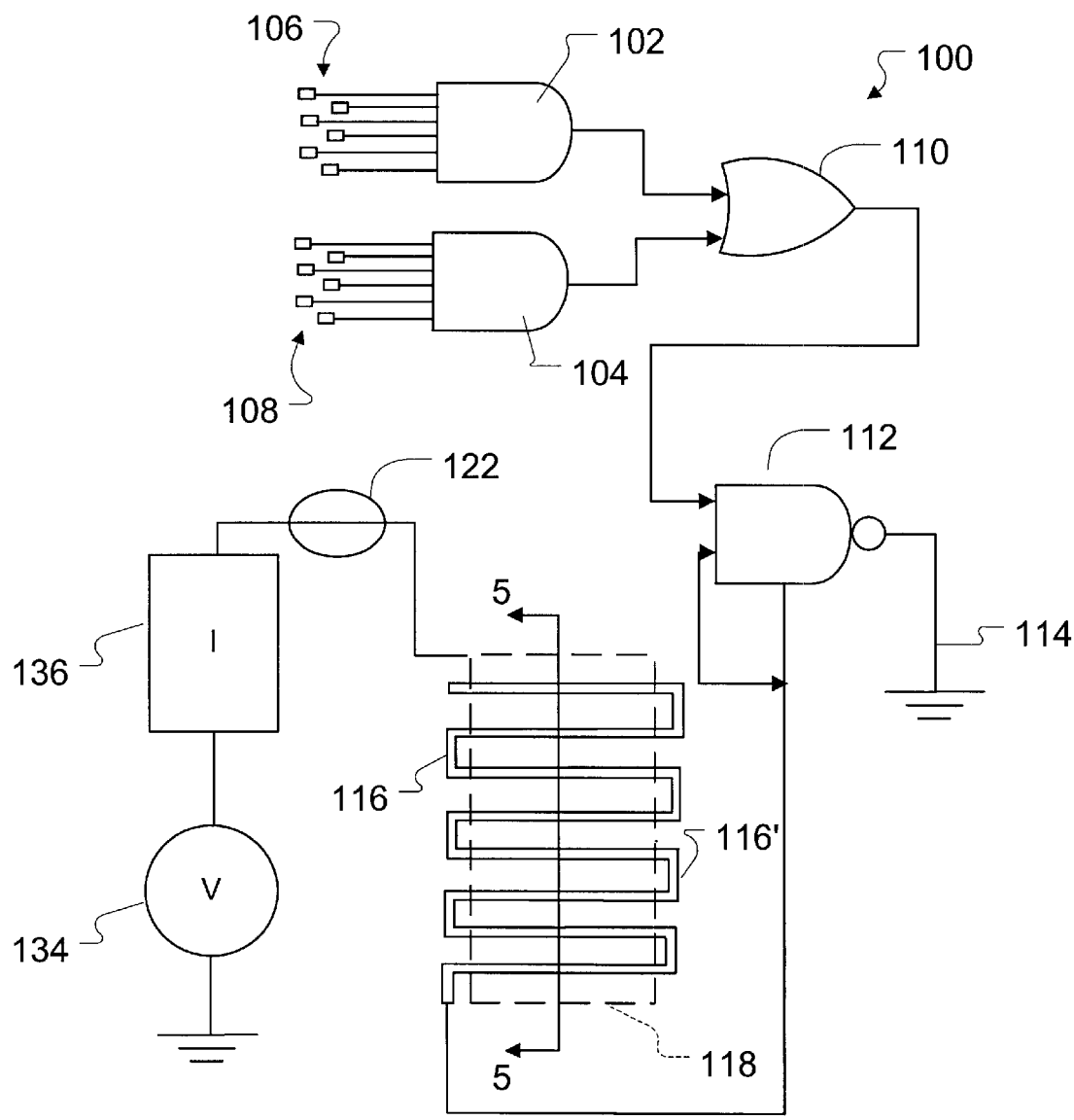
FIG. 4 is a circuit diagram of the present invention implemented under one bond pad.

During diagnostic testing, but not normal device use, voltage source (134) in FIG. 4 and ammeter (136) are connected to pin (122). If bond pad (118) would be driven high, a continuous polysilicon meander (116) would cause one of the input signals of NAND gate (112) to go high. If the second input signal to NAND gate (112) were also driven high, there would then be a low resistance between voltage source (134) through the pad (118) and meander (116) and drain of NAND gate (112) connected to ground 114 and current would be measured on the ammeter (136).

Figure 2:
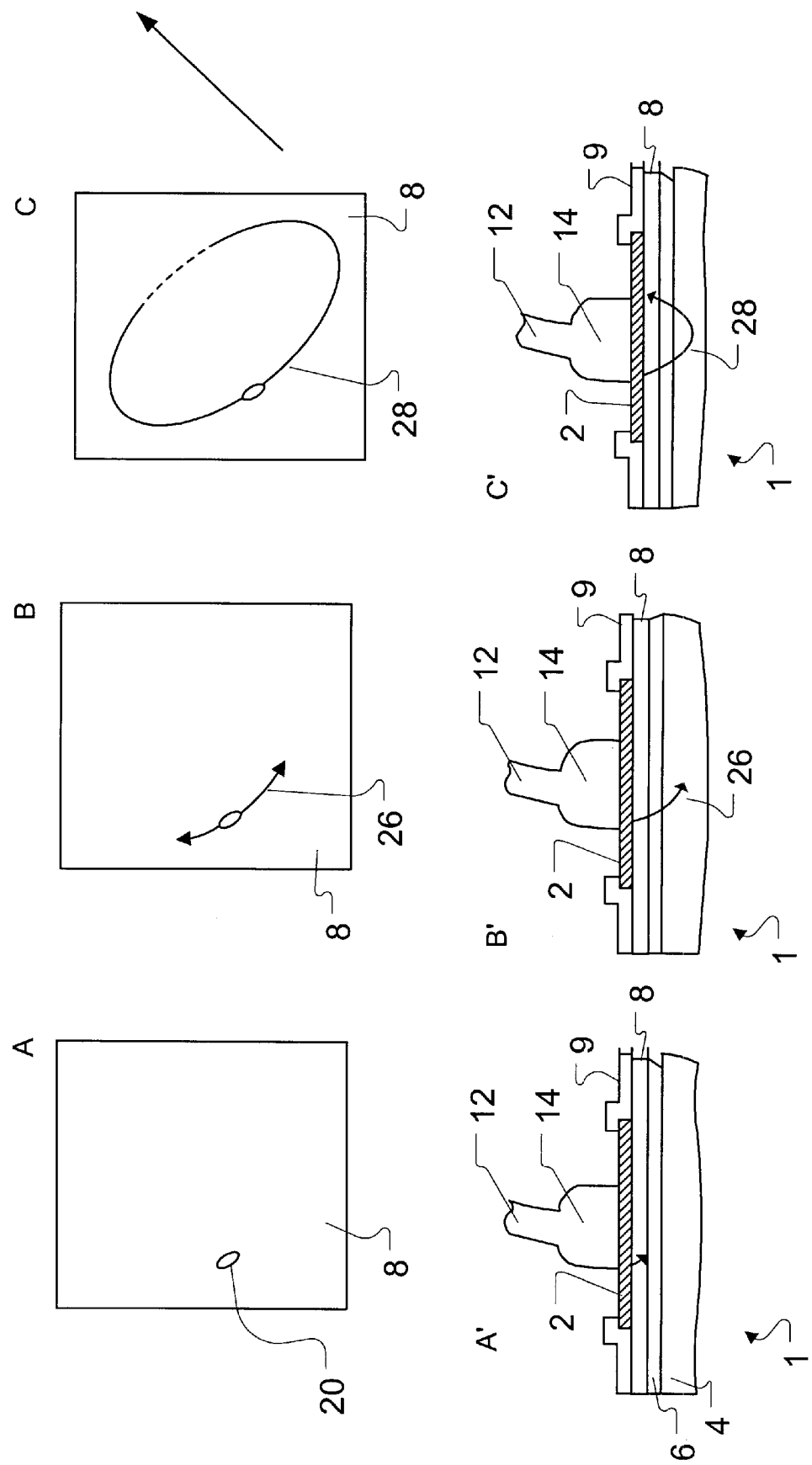
FIG. 2 is a cross sectional view taken through the wire bond pad of a micro-electronic device showing the progression of wire bond pad crater formation.
Figure 3:
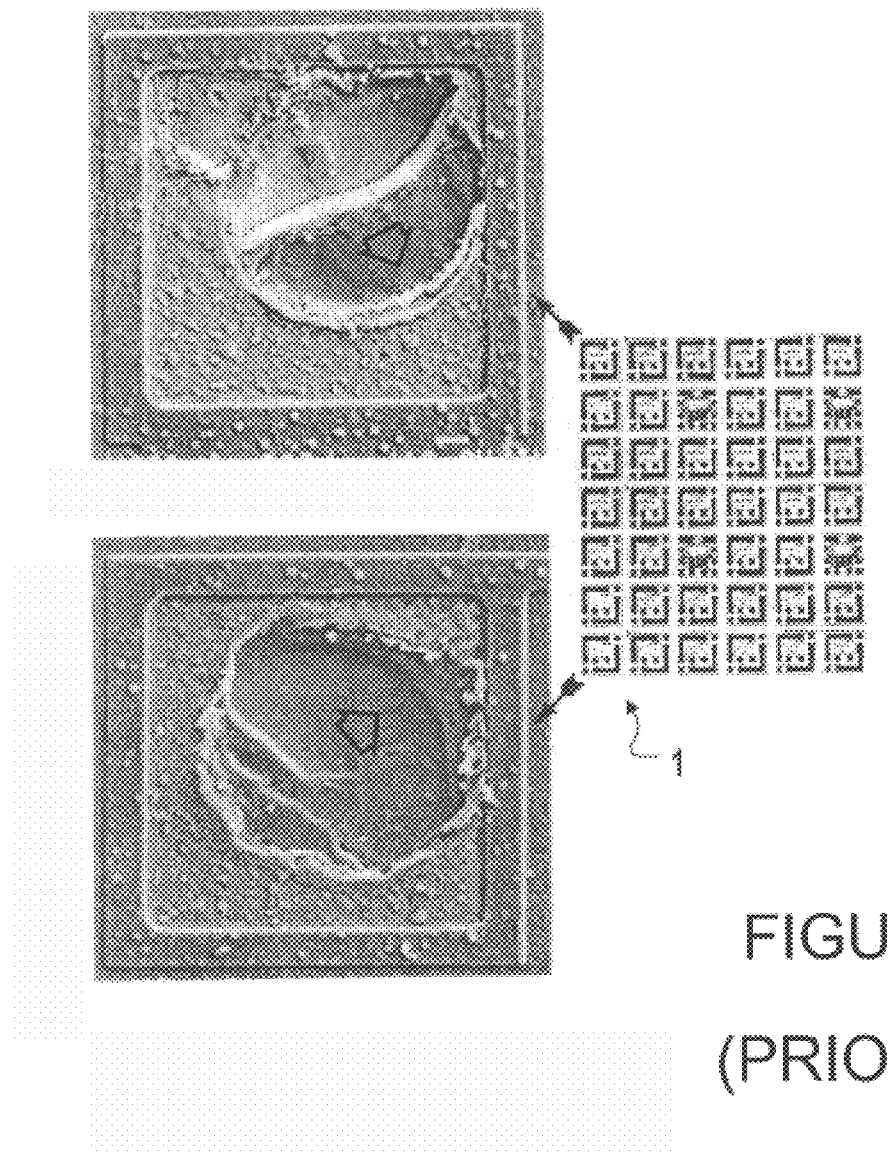
FIG. 3 is a photomicrograph of the areas beneath bond pads having suffered bond pad crater failure.

In the event that a crack forms beneath meander (116), the crack would propagate through meander (116), severing it, opening the circuit, and precluding current flow from the pad (118) to ground (114) through the meander (116). The fractured meander (116) renders the crack detectable so long as the length of the fractured portion under the meander is greater than the pitch of the meander (116), i.e. in this example approximately 0.5 $\mu$m. This value is, of course, significantly smaller than either a propagated crack as shown in FIG. 2B or a fully developed crater as shown in FIGS. 2C and 3. Indeed, the present invention is shown to be capable of disclosing "crater jeopardy" in the form of microcracks beneath the bond pad long before the formation of larger cracks or craters.

The second input signal to NAND gate (112) will go high if either of two "special" patterns of inputs is driven high. This first special pattern, or master key, is applied to the pins connected to the pads (106) which in turn are connected to the respective input terminals of the six-input AND gate (102) resulting in all input signals to the AND gate (102) going high. Accordingly, the first master key pattern causes the output signal of the six-input AND gate (102) to go high which through OR gate (110) causes the second input signal to the NAND gate (112) to go high. With the meander (116) intact, there is a low resistance between the source of the NAND gate (112) and ground (114). Thus, the ammeter (136) will measure current flow from the pad (118) to the ground (114) through the meander (116). Clearly, a fractured meander, indicating cracking/cratering of a layer below, would not allow such current to flow, which would again be indicated by the ammeter (136).

The test sequence will then check each pad for crater jeopardy as previously described, except for those pads to which the first master key signals are applied. When the test sequence has finished all other pads the master key signals applied to the input terminals of the AND gate are removed, and a second master key is applied to the pads (108) to drive the input signals to the AND gate (104) high to check the six pads (106) utilized with the first master key.

If a pattern other than one of the two master keys were imposed on the pad (106 or 108), each of the pads would show a large impedance to ground exhibiting a resistance corresponding to junction leakage, typically several orders of magnitude larger than the meander resistance.

In the event that a master key pattern is imposed during normal device operation, a small additional leakage current will flow from the power supply. However, this current, which is typically less than one µA per pad, is negligible, in any event less than the typical device input/output leakage specification which is usually a maximum 10 µA.

Assuming for example that an "A" step revision of a mask set determines a product having a particular set of six pads (106 of FIG. 4) to be hard wired to the input terminals of the AND gate (102), a test sequence corresponding to this A step revision is drawn up to operate in accordance with this design implementation. However, a "B" step revision of the mask set could possibly result in the input terminals of the AND gate (102) being connected to a set of pads some or all of which may be different from the original set of pads (106). Thus, a test sequence corresponding to the B step revision must be written so that the pads which are now connected to the input terminals of the AND gate (102) are driven high so that the test may function properly. If the test sequence corresponding to the A step revision were used for a product with the B step revision, one or more of the six pads of the AND gate (102) will not be driven high. This results in no current flowing through the meander (116) for any pad tested indicating that it is highly likely that the incorrect test is being used rather than that every meander has failed. That is to say, there is indicated a mismatch between the mask revision and the test. Thus, it becomes clear that the incorrect test sequence for that product is being used.

A unique combination of six inputs corresponding to the stepping numbers and/or letters will permit discrimination between $2^6$ or 64 different patterns. This number is deemed to be adequate for most integrated circuit products. If still more steppings per product are needed, one or more bits could be added to the master key and a corresponding one or more inputs could be added to one or more of the AND gates. The number of inputs to each AND gate can vary, for example, from 5 to 15 as chosen so that the system can be configured to apply to a wide variety of products.

Figure 6A:
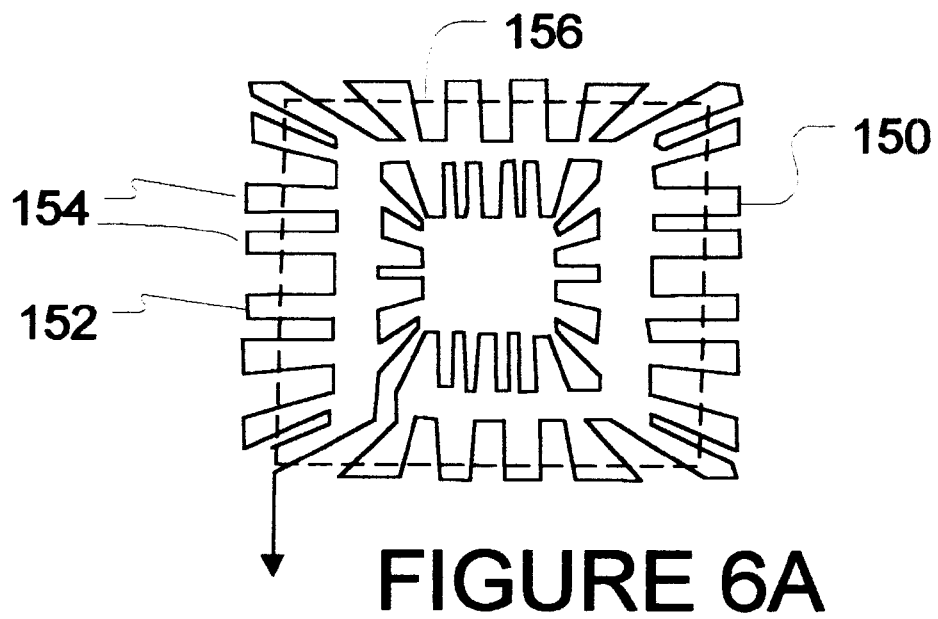
FIGS. 6A and 6B present a plan view of an alternate embodiment of meander trace.
Figure 6B:
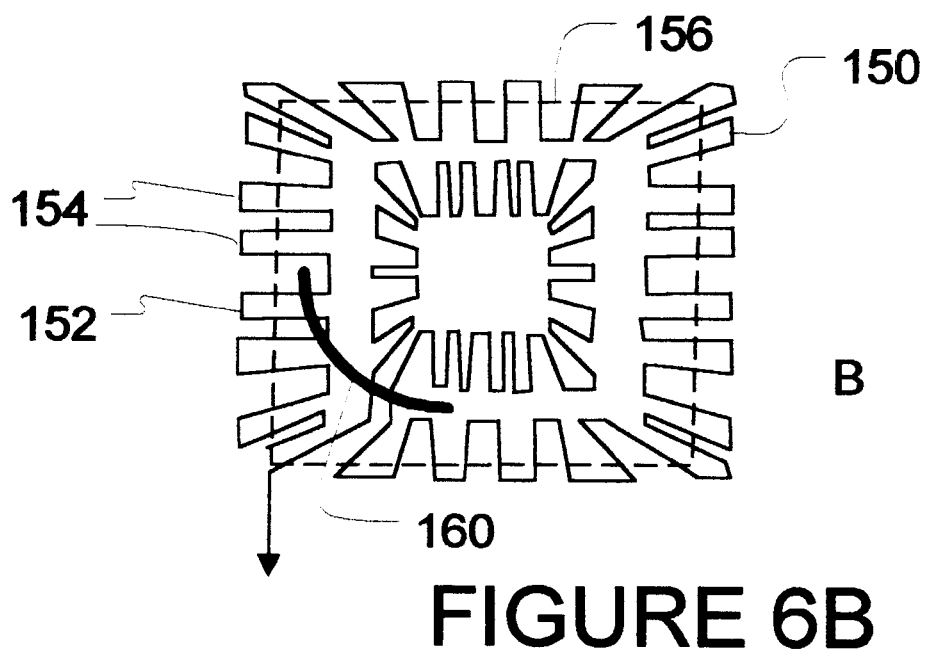

An alternative meander pattern (150) is shown in FIGS. 6A and 6B. Due to the exigencies of scale drawing, the example shown is illustrative of the geometry contemplated by this embodiment and does not serve as a mask for actually creating the meander. The alternate meander (150) is shown to include a generally radially disposed meander trace (152). In this embodiment meander trace (152) is a nested structure having a plurality of generally externally radiating arms (154). Each of the arms (154) forms a part of the continuous meander (150). The meander (150) is connected to a bond pad (156 shown in dotted lines). While for purposes of illustration clarity, substantial distance is shown between each element of meander trace (152), it will be appreciated that the pitch and meander arm width are substantially the same as meander (116). The geometry of this embodiment is designed to detect microcrack propagation more effectively than the previously discussed "down and back" geometry, as it responds equally in all directions to the generally elliptical craters formed by crack propagation.

FIG. 6B illustrates the effect of the formation of a crack (160) on the meander (150). For the previously discussed crater formation geometry, radially extending arms (154) are deemed more likely to detect any arbitrary orientation of crack (160) earlier than the more simply configured meander (116) previously discussed.

The term meander as used herein is used to define an array having any number of alternative geometry or patterns. By way of illustration, but not limitation, some of these pattern geometry's include the previously discussed meander as well as combs, grids, radial patterns, axial patterns, random patterns, fractal patterns, linear arrays, and combinations and permutations thereof. The principles of the present invention specifically contemplate such alternative geometries and patterns. Furthermore, the meander material may be any electrically conductive, frangible, brittle material such as the already described polysilicon, silicon, intermetallic silicide, or metal.

It will be appreciated that the term "pin", "lead" or "bond wire" as used herein comprehends not only traditional wire-to-semiconductor connections, but also solder bumps, flip-chip attachment points, and substantially all other electrical contact methodologies for electrically connecting an internal bond pad with an external electrical connection (pin or lead) which are known to those of ordinary skill in the semiconductor arts.

The foregoing description of the embodiment of the invention has been presented for purposes of illustration and description. It is not intended to be exhaustive or to limit the invention to the precise form disclosed. Other modifications or variations are possible in light of the above teachings. The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A semiconductor device including at least one layer formed on a substrate and a plurality of wire bond pads electrically connected with a corresponding plurality of external electrical contacts, the semiconductor device implementing a non-destructive method of testing for the formation of a crack in a portion of the semiconductor device beneath selected ones of the plurality of bond pads, the semiconductor device further comprising:

a plurality of sensor circuits disposed on the semiconductor device; and an electrically conductive element disposed beneath each of the selected ones of the plurality of bond pads, one end of each electrically conductive element being electrically connected to its respective one of the selected ones of the plurality of bond pads and the opposite end of each electrically conductive element to a respective one of the plurality of sensor circuits.

2. The semiconductor device of claim 1 and further comprising a combination of specified ones of the plurality of external electrical contacts corresponding to the stepping numbers of the semiconductor device, the combination defining a master key.

3. The semiconductor device of claim 1 and further comprising at least one electrically conductive element having a radially disposed geometry.

4. The semiconductor device of claim 3 and further comprising at least one electrically conductive element having a nested radially disposed geometry, including a plurality of externally radiating arms.

5. The semiconductor device of claim 3 further comprising at least one electrically conductive element selected from a group consisting of down and back pattern, comb, grid, radial pattern, nested pattern, axial pattern, random pattern, fractal pattern, linear array.

6. The semiconductor device of claim 1 wherein at least one of the plurality of sensor circuits further comprises a plurality of logic gates disposed on the semiconductor device.

7. The semiconductor device of claim 6 or at least one of the plurality of sensor circuits further comprises:

a two-input NOR gate disposed on the semiconductor device;

first and a second multiple-input AND gates disposed on the semiconductor device and electrically coupled to the two-input OR gate;

a first and a second selected number of the plurality of external electrical contacts, each of the first and second selected number of the plurality of external electrical contacts defining a master key corresponding to the stepping numbers of the semiconductor device, and electrically coupled to each of the inputs of the first and second multiple-input AND gates; and a two-input NAND gate disposed of the semiconductor device, the inputs to the two-input NAND gate being from the electrically conductive element and the two-input OR gate and the output of the two-input NAND gate being to ground.

8. The semiconductor device of claim 7 wherein each of the first and second AND gates has from 5 to 15 inputs.

9. The semiconductor device of claim 1 further comprising at least one electrically conductive element formed from the group consisting of silicon, polysilicon, metallized silicide, metal, and metallized layers.

10. The semiconductor device of claim 1 further comprising at least one electrically conductive element formed to cover substantially all the area beneath its respective bond pad.

* * * * *